(12) United States Patent
Goto et al.

(10) Patent No.: US 11,029,597 B2
(45) Date of Patent: Jun. 8, 2021

(54) METHOD FOR PRODUCING PATTERN LAMINATE, METHOD FOR PRODUCING REVERSAL PATTERN, AND PATTERN LAMINATE

(71) Applicant: FUJIFILM Corporation, Tokyo (JP)

(72) Inventors: Yuichiro Goto, Haibara-gun (JP); Kazuhiro Marumo, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 32 days.

(21) Appl. No.: 16/112,003

(22) Filed: Aug. 24, 2018

(65) Prior Publication Data

US 2018/0364566 A1   Dec. 20, 2018

Related U.S. Application Data

(63) Continuation of application No. PCT/JP2017/006243, filed on Feb. 21, 2017.

(30) Foreign Application Priority Data

Feb. 29, 2016 (JP) .............................. JP2016-037880

(51) Int. Cl.
*G03F 7/00* (2006.01)
*H01L 21/308* (2006.01)
(Continued)

(52) U.S. Cl.
CPC .......... *G03F 7/0002* (2013.01); *B81C 1/0046* (2013.01); *G03F 7/027* (2013.01);
(Continued)

(58) Field of Classification Search
None
See application file for complete search history.

(56) References Cited

U.S. PATENT DOCUMENTS

| 2004/0102048 | A1 | 5/2004 | Yamaguchi | |
| 2004/0248042 | A1* | 12/2004 | Toriumi | G03F 7/0395 430/311 |

(Continued)

FOREIGN PATENT DOCUMENTS

| JP | 2004-179254 A | 6/2004 |
| JP | 2005-203563 A | 7/2005 |

(Continued)

OTHER PUBLICATIONS

Office Action dated Jun. 18, 2019 from the Japanese Patent Office in counterpart Japanese application No. 2018-503050.

(Continued)

*Primary Examiner* — Jiong-Ping Lu
(74) *Attorney, Agent, or Firm* — Sughrue Mion, PLLC

(57) ABSTRACT

Provided are a method for producing a pattern laminate, the pattern laminate having a first layer having a pattern on an object to be processed and a second layer, which has a small waviness after etching (ΔLWR), in which the method includes a step of forming a first layer having a pattern on an object to be processed and a step of forming a second layer on the first layer, and the glass transition temperature of the first layer is 90° C. or higher; a method for producing a reversal pattern; and a pattern laminate.

10 Claims, 2 Drawing Sheets

(51) Int. Cl.
  *H01L 21/311* (2006.01)
  *B81C 1/00* (2006.01)
  *G03F 7/027* (2006.01)
  *H01L 21/027* (2006.01)
  *B82Y 40/00* (2011.01)
  *G03F 7/075* (2006.01)

(52) U.S. Cl.
  CPC ...... *H01L 21/0271* (2013.01); *H01L 21/3081* (2013.01); *H01L 21/3086* (2013.01); *H01L 21/31116* (2013.01); *H01L 21/31138* (2013.01); *B82Y 40/00* (2013.01); *G03F 7/0752* (2013.01)

(56) References Cited

U.S. PATENT DOCUMENTS

| | | |
|---|---|---|
| 2005/0176254 A1 | 8/2005 | Takeishi et al. |
| 2006/0063112 A1 | 3/2006 | Sreenivasan |
| 2008/0026322 A1 | 1/2008 | Ogihara et al. |
| 2008/0274426 A1* | 11/2008 | Fuji ............ G03F 7/0397 430/287.1 |
| 2010/0108639 A1 | 5/2010 | Kasono |
| 2011/0297896 A1 | 12/2011 | Kim et al. |
| 2012/0021180 A1 | 1/2012 | Miyake et al. |
| 2013/0120485 A1* | 5/2013 | Kodama ............ B41J 2/04543 347/14 |
| 2014/0121292 A1 | 5/2014 | Kodama et al. |
| 2016/0009946 A1 | 1/2016 | Kitagawa et al. |
| 2016/0240411 A1* | 8/2016 | Motokawa ........ H01L 21/67167 |
| 2017/0146908 A1* | 5/2017 | Shirakawa ............ G03F 7/039 |

FOREIGN PATENT DOCUMENTS

| | | |
|---|---|---|
| JP | 2006-521702 A | 9/2006 |
| JP | 2009-038085 A | 2/2009 |
| JP | 2011-118373 A | 6/2011 |
| JP | 2011-157482 A | 8/2011 |
| JP | 2012-500408 A | 1/2012 |
| JP | 2012-518052 A | 8/2012 |
| JP | 2013-235885 A | 11/2013 |
| JP | 2014-150263 A | 8/2014 |
| JP | 2015-185798 A | 10/2015 |
| TW | 200807157 A | 2/2008 |
| TW | 201437767 A | 10/2014 |
| TW | 201538600 A | 10/2015 |
| WO | 2008/126313 A1 | 10/2008 |
| WO | 2010/018430 A1 | 8/2010 |
| WO | 2010/110121 A1 | 9/2010 |
| WO | 2013/008940 A1 | 1/2013 |

OTHER PUBLICATIONS

Office Action dated Nov. 12, 2019, from the Japanese Patent Office in Japanese Application No. 2018-503050.
International Search Report of PCT/JP2017/006243 dated Apr. 18, 2017 [PCT/ISA/210].
Written Opinion of PCT/JP2017/006243 dated Apr. 18, 2017 [PCT/ISA/237].
International Preliminary Report on Patentability issued in International Application No. PCT/JP2017/006243 dated Sep. 4, 2018.
Office Action dated Dec. 10, 2019, issued by the Korean Intellectual Property Office in Korean Application No. 10-2018-7024567.
Office Action dated Jun. 1, 2020, from the Korean Intellectual Property Office in KR Application No. 10-2018-7024567.
Office Action dated Jul. 7, 2020, from the Intellectual Property Office of Taiwan in Taiwan Application No. 106105814.

* cited by examiner

METHOD FOR PRODUCING PATTERN LAMINATE, METHOD FOR PRODUCING REVERSAL PATTERN, AND PATTERN LAMINATE

CROSS-REFERENCE TO RELATED APPLICATIONS

This application is a Continuation of PCT International Application No. PCT/JP2017/006243 filed on Feb. 21, 2017, which claims priority under 35 U.S.C § 119(a) to Japanese Patent Application No. 2016-037880 filed on Feb. 29, 2016. Each of the above application(s) is hereby expressly incorporated by reference, in its entirety, into the present application.

BACKGROUND OF THE INVENTION

1. Field of the Invention

The present invention relates to a method for producing a pattern laminate, a method for producing a reversal pattern, and a pattern laminate.

2. Description of the Related Art

An imprint method is a technique for transferring a fine pattern onto a material by pressing a shaping mold (which is generally referred to as a "mold" or a "stamper"), on which a pattern has been formed, against the material. Since use of the imprint method makes it possible to achieve easy and precise manufacture of a fine pattern, the method has recently been expected to be applicable to various fields. In particular, nanoimprint techniques for forming a fine pattern on a nano-order level have attracted attention.

As the imprint method, there have been proposed methods referred to as a thermal imprint method and a photoimprint method, depending on the transfer method. In the thermal imprint method, a mold is pressed against a thermoplastic resin which has been heated to a glass transition temperature thereof or higher, cooled, and then released therefrom, thereby forming a fine pattern. In the thermal imprint method, various materials can be selected. In the photoimprint method, a mold is released after a photocurable composition is photocured while the mold is pressed against the photocurable composition. In the photoimprint method, high-pressure and high-temperature heating is not necessary and it is possible to simply manufacture a fine pattern.

A method in which an imprint method is carried out on an object to be processed, and the object to be processed is processed with etching using a pattern thus obtained as a mask is referred to as imprint lithography. In particular, a method of carrying out microfabrication using a transferred imprint pattern as a mask is referred to as nanoimprint lithography (NIL), which has been under development as a next-generation lithography technique.

Recently, imprint lithography in a reversion process using a pattern laminate (referred to as a multilayer stacked structure in some cases) (refer to JP2006-521702A and US2006/0063112A) has been proposed. In JP2006-521702A and US2006/0063112A, it is suggested that by etching a pattern laminate having a first layer having a pattern structure, and a second layer having etching selectivity to the first layer, a mask having the second pattern (also referred to as a reversal pattern) having a shape opposite to that of the pattern of the first layer is formed. Further, JP2006-521702A, US2006/0063112A, and JP2014-150263A disclose an example in which a first layer having a pattern structure is formed using a photocurable composition, and a second layer having etching selectivity to the first layer is formed using a silicone resin in the section of Examples.

SUMMARY OF THE INVENTION

Imprint lithography is required to have no occurrence of deformation of a pattern after etching, and the like. However, the present inventors have conducted intensive studies on JP2006-521702A and US2006/0063112A (or JP2014-150263A as one of corresponding Japanese publications thereof), and thus, the present inventors have found that in Examples described in these publications, it is difficult to reliably form a reversal pattern. That is, in a case where a pattern laminate having a first layer having a pattern structure using a photocurable composition formed thereon is produced and subjected to imprint lithography in some Examples, it could be seen that deformation of the pattern occurs after etching, and thus, etching roughness increases. In particular, since a waviness after etching (a difference in line width roughness between before and after etching, hereinafter also referred to as "ΔLWR") increases, it was difficult to reliably process an object to be processed into a second pattern (reversal pattern) having a shape opposite to that of the first pattern in the methods of Examples in JP2006-521702A, US2006/0063112A, and JP2014-150263A.

An object of the present invention is to provide a method for producing a pattern laminate, the pattern laminate having a first layer having a pattern on an object to be processed and a second layer, which has a small waviness after etching (ΔLWR).

The present inventors have conducted studies in order to accomplish the object, and as a result, they have discovered that it is possible to reduce the waviness after etching (ΔLWR) by increasing the glass transition temperature of the first layer to a higher point than that in the related art.

The present invention which is a means for accomplishing the object and preferred configurations of the present invention are set forth below.

[1] A method for producing a pattern laminate, comprising:
a step of forming a first layer having a pattern on an object to be processed; and
a step of forming a second layer on the first layer,
in which the glass transition temperature of the first layer is 90° C. or higher.

[2] The method for producing a pattern laminate as described in [1],
in which the pattern laminate is used for a reversion process.

[3] The method for producing a pattern laminate as described in [1] or [2], further comprising a step of heating the second layer.

[4] The method for producing a pattern laminate as described in any one of [1] to [3],
in which the step of forming a first layer includes a step of forming a first layer by an imprint method using the first curable composition.

[5] The method for producing a pattern laminate as described in [4],
in which the Onishi parameter of the first curable composition is less than 3.8.

[6] The method for producing a pattern laminate as described in [4] or [5], in which the first curable composition includes a polymerizable compound, and the proportion of the polymerizable compound including an aliphatic ring having a crosslinked structure with respect to all the polymerizable compounds included in the first curable composition is less than 30% by mass.

[7] The method for producing a pattern laminate as described in any one of [4] to [6],
in which the viscosity of the first curable composition at 23° C. is less than 10 mPa·s.

[8] The method for producing a pattern laminate as described in any one of [1] to [7],
in which the first layer has a pattern with a size of 100 nm or less.

[9] The method for producing a pattern laminate as described in any one of [1] to [8],
in which the step of forming a second layer includes a step of forming a second layer by curing the second curable composition.

[10] The method for producing a pattern laminate as described in any one of [1] to [9],
in which the second layer includes a Si atom-containing compound or a metal.

[11] The method for producing a pattern laminate as described in any one of [1] to [10],
in which the etching selectivity ratio of the first layer to the second layer is 1.2 to 10.

[12] A method for producing a reversal pattern, comprising the method for producing a pattern laminate as described in any one of [1] to [11], the method comprising:
a step of making the second layer thin until a region having the pattern of the first layer exposed therein and a region having the first layer and the second layer laminated therein are formed; and
a step of forming a reversal pattern by selectively etching the region having the pattern of the first layer exposed therein.

[13] The method for producing a reversal pattern as described in [12],
in which the step of making the second layer thin is an etch-back step of etching the second layer.

[14] A pattern laminate comprising:
an object to be processed;
a first layer having a pattern positioned on the object to be processed; and
a second layer positioned on the first layer,
in which the glass transition temperature of the first layer is 90° C. or higher.

According to the present invention, it is possible to provide a method for producing a pattern laminate, the pattern laminate having a first layer having a pattern on an object to be processed and a second layer, which has a small waviness after etching (ΔLWR).

In addition, according to the present invention, it is possible to provide a method for producing a reversal pattern and a pattern laminate.

DESCRIPTION OF THE PREFERRED EMBODIMENTS

Figure 1:
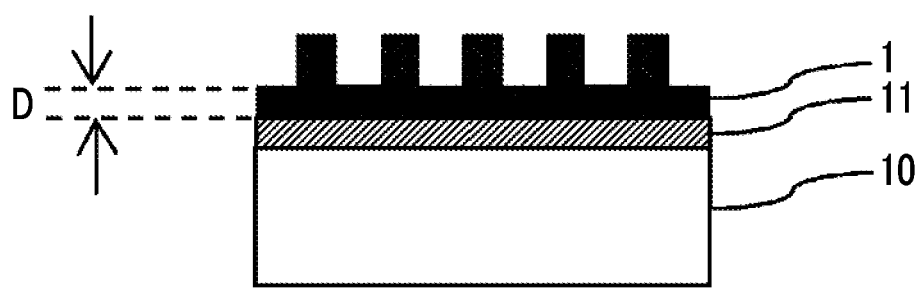
FIG. 1 is a schematic view showing the cross-section of an example of a member obtained by the step of forming a first layer having a pattern on an object to be processed in the method for producing a pattern laminate of the present invention.

Hereinafter, the contents of the present invention will be described in detail.

In the present specification, the numerical ranges shown with "to" are used to mean ranges including the numerical values indicated before and after "to" as lower limit values and upper limit values, respectively.

In the present specification, "(meth)acrylate" represents acrylate and methacrylate, "(meth)acryl" represents acryl and methacryl, "(meth)acryloyl" represents acryloyl and methacryloyl, and "(meth)acryloyloxy" represents acryloyloxy and methacryloyloxy.

In the present specification, "imprint" preferably refers to pattern transfer with a size of 1 nm to 10 mm, and more preferably refers to pattern transfer with a size of approximately 10 nm to 100 μm (nanoimprint).

In citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

The viscosity in the present invention refers to a viscosity at 23° C. unless otherwise specified.

In the present specification, "exposure" includes, unless otherwise specified, not only exposure using light but also lithography using particle rays such as electron beams and ion beams. Further, "light" in the exposure means actinic rays or radiation. In addition, "actinic rays" or "radiation" means, for example, a bright line spectrum of a mercury lamp, far ultraviolet rays typified by an excimer laser, extreme ultraviolet rays (EUV light), X-rays, electron beams, or the like.

Unless otherwise specified, the weight-average molecular weight (Mw) in the present invention refers to that as measured by gel permeation chromatography (GPC) unless otherwise specified.

[Method for Producing Pattern Laminate]

The method for producing a pattern laminate of the present invention includes:
a step of forming a first layer having a pattern on an object to be processed, and
a step of forming a second layer on the first layer,
in which the glass transition temperature of the first layer is 90° C. or higher.

By such a configuration, it is possible to provide a method for producing a pattern laminate, the pattern laminate having a first layer having a pattern on an object to be processed and a second layer, which has a small waviness after etching (ΔLWR).

Since the layer having a high glass transition temperature has insufficient flexibility, it has been difficult to perform a release from a mold in a case where the first layer having a pattern is formed by carrying out an imprint method. Thus, use of a layer having a high glass transition temperature in a case where the first layer having a pattern is formed by the imprint method has substantially not been investigated in imprint lithography including a reversion process and other processes.

However, in the present invention, in a case where the glass transition temperature of the first layer (hereinafter also referred to as a Tg) is 90° C. or higher, it is possible to suppress the mixing of the first layer and the second layer in a case where the second layer is provided on the first layer having a pattern. As a result, it is thought that it is possible to suppress the formation of a mixed region of the first layer having reduced etching selectivity and the second layer, leading to an increase in a difference in the composition between the inside and the outside in the pattern boundary, and therefore, ΔLWR can be reduced. The mixing of the first layer and the second layer is not bound to any theory, but may occur at different timings. For example, the mixing can occur in a case where the second curable composition permeates into the first layer at a time of applying the second curable composition for forming a second layer on the first layer having a pattern. Further, the mixing of the first layer and the second layer can occur by softening the first layer in the step of heating the second layer, as desired. It is presumed that the mixing of the first layer and the second layer which can occur at such various timings can be suppressed by further hardening the first layer or making it more difficult for the first layer to be softened, as compared with the related art, by setting the glass transition temperature of the first layer to 90° C. or higher. This is also the same as in a case where the first layer and the second layer are laminated through another intermediate layer. That is, it is possible to suppress the mixing of the first layer with another intermediate layer by setting the glass transition temperature of the first layer to 90° C. or higher, and as a result it is presumed that it is also possible to suppress the mixing of the first layer and the second layer.

On the other hand, all of the first layers described in US2004/0188381A (whose corresponding Japanese publication is JP2006-521702A) and JP2014-150263A (whose corresponding US publication is US2006/0063112) has a glass transition temperature of lower than 80° C.

Hereinafter, preferred aspects of the method for producing a pattern laminate of the present invention will be described.

<Step of Forming First Layer Having Pattern on Object to be Processed>

The method for producing a pattern laminate of the present invention includes a step of forming a first layer having a pattern on an object to be processed.

FIG. 1 is a schematic view showing the cross-section of an example of a member obtained by a step of forming a first layer 1 on an object 10 to be processed in the method for producing a pattern laminate of the present invention.

In FIG. 1, the first layer 1 is formed on the object 10 to be processed through an adhesion material 11. However, the object 10 to be processed and the first layer 1 may be directly in contact with each other.

As an adhesion material, the adhesion materials described in Examples of JP2014-3123A, a carbon film (Spin-On-Carbon (SOC)), or the like can be used. Further, a known underlayer film to be used between the object to be processed and the first layer in the imprint method may also be used as the adhesion material.

The member obtained in the step of forming the first layer 1 on the object 10 to be processed, shown in FIG. 1, has a pattern of a residual film contained in the first layer 1. The thickness D of the residual film contained in the first layer is shown in FIG. 1.

In the present invention, the pattern laminate is preferably used for a reversion process.

The reversion process refers to a method for producing a reversal pattern in which a pattern portion (hereinafter also referred to as a convex portion) and the non-pattern portion (also referred to as a concave portion) are oppositely positioned with respect to the first layer having a pattern formed on the object to be processed. Specifically, the reversion process refers to the method for producing a reversal pattern of the present invention which will be described later. That is, the pattern laminate of the present invention preferably finds its applications in a use for the method for producing a reversal pattern of the present invention.

<<Object to Be Processed>>

The object to be processed is not particularly limited, and reference can be made to the descriptions in paragraph 0103 of JP2010-109092A (whose corresponding US publication is US2011/0199592A), the contents of which are incorporated herein by reference. Further examples of the object to be processed include a sapphire substrate, a silicon carbide substrate, a gallium nitride substrate, a metal aluminum substrate, an amorphous aluminum oxide substrate, a polycrystalline aluminum oxide substrate, and a substrate made of GaAsP, GaP, AlGaAs, InGaN, GaN, AlGaN, ZnSe, AlGaInP, or ZnO. Further, examples of specific materials of the glass substrate include aluminosilicate glass, aluminoborosilicate glass, and barium borosilicate glass.

In the present invention, the object to be processed is preferably a silicon substrate, and more preferably in the shape of a silicon wafer.

<<Preparation of First Curable Composition>>

In the present invention, the step of forming a first layer preferably includes a step of forming a first layer by an imprint method using the first curable composition.

(Onishi Parameter)

The Onishi parameter of the first curable composition is preferably 4.0 or less, more preferably less than 3.8, particularly preferably 3.7 or less, more particularly preferably 3.6 or less, still more particularly preferably 3.5 or less, and most preferably 3.3 or less. The lower limit value of the Onishi parameter is not particularly limited, but can be set to, for example, 2.8 or more. In a case where the Onishi parameter of the first curable composition falls within a range of the upper limit value (particularly less than 3.8), ΔLWR can be reduced, and thus, the defects after etching can also be suppressed.

(Viscosity)

In the present invention, the viscosity of the first curable composition at 23° C. is preferably less than 100 mPa·s, more preferably less than 20 mPa·s, particularly preferably less than 10 mPa·s, and more particularly preferably 9 mPa·s or less. In a case where the viscosity of the first curable composition at 23° C. falls within a range of the upper limit value (particularly less than 10 mPa·s), the first curable composition easily goes into a mold, and thus, the defects after etching are easily suppressed.

Hereinafter, the respective components of the first curable composition will be described.

(Polymerizable Compound)

The first curable composition preferably includes a polymerizable compound. The polymerizable compound is not particularly limited as long as it does not depart from the spirit of the present invention. Examples of the curable group contained in the polymerizable compound include an ethylenically unsaturated bond-containing group, an epoxy group, and an oxetanyl group. Examples of the ethylenically unsaturated bond-containing group include a (meth)acryloyl group, a (meth)acryloyloxy group, a vinyl group, an allyl group, and a vinyl ether group, with the (meth)acryloyl group and the (meth)acryloyloxy group being preferable. Specific examples of the polymerizable compound include those described in paragraph Nos. 0020 to 0098 of JP2011-231308A, the contents of which are incorporated herein by reference.

From the viewpoint of lowering the Onishi parameter of the first curable composition, the Onishi parameter of the polymerizable compound is preferably 4.0 or less, more preferably less than 3.8, particularly preferably 3.7 or less, more particularly preferably 3.6 or less, still more particularly preferably 3.5 or less, and most preferably 3.3 or less. The lower limit value of the Onishi parameter of the polymerizable compound is not particularly limited, but can be set to, for example, 2.5 or more.

Here, the Onishi parameter is a value calculated by the following equation.

Onishi parameter=(the total number of atoms in the polymerizable compound)/{(the number of carbon atoms in the polymerizable compound)−(the number of oxygen atoms in the polymerizable compound)}

—Monofunctional Polymerizable Compound—

As the monofunctional polymerizable compound, a compound having one or more ethylenically unsaturated bond-containing group is preferable. Examples of the compound having one or more ethylenically unsaturated bond-containing group include methyl (meth)acrylate, ethyl (meth)acrylate, butyl (meth)acrylate, N-vinylpyrrolidinone, 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 4-hydroxybutyl (meth)acrylate, an acrylic acid dimer, benzyl (meth)acrylate, 1- or 2-naphthyl (meth)acrylate, butoxyethyl (meth)acrylate, cetyl (meth)acrylate, ethylene oxide (hereinafter referred to as "EO")-modified cresol (meth)acrylate, dipropylene glycol (meth)acrylate, ethoxylated phenyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydipropylene glycol (meth)acrylate, methoxytripropylene glycol (meth)acrylate, methoxypolyethylene glycol (meth)acrylate, methoxytriethylene glycol (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tribromophenyl (meth)acrylate, EO-modified tribromophenyl (meth)acrylate, tridodecyl (meth)acrylate, paraisopropenylphenol, N-vinylpyrrolidone, N-vinylcaprolactam, and n-hexyl (meth)acrylate.

It is also preferable that the following compound is used as the monofunctional polymerizable compound.

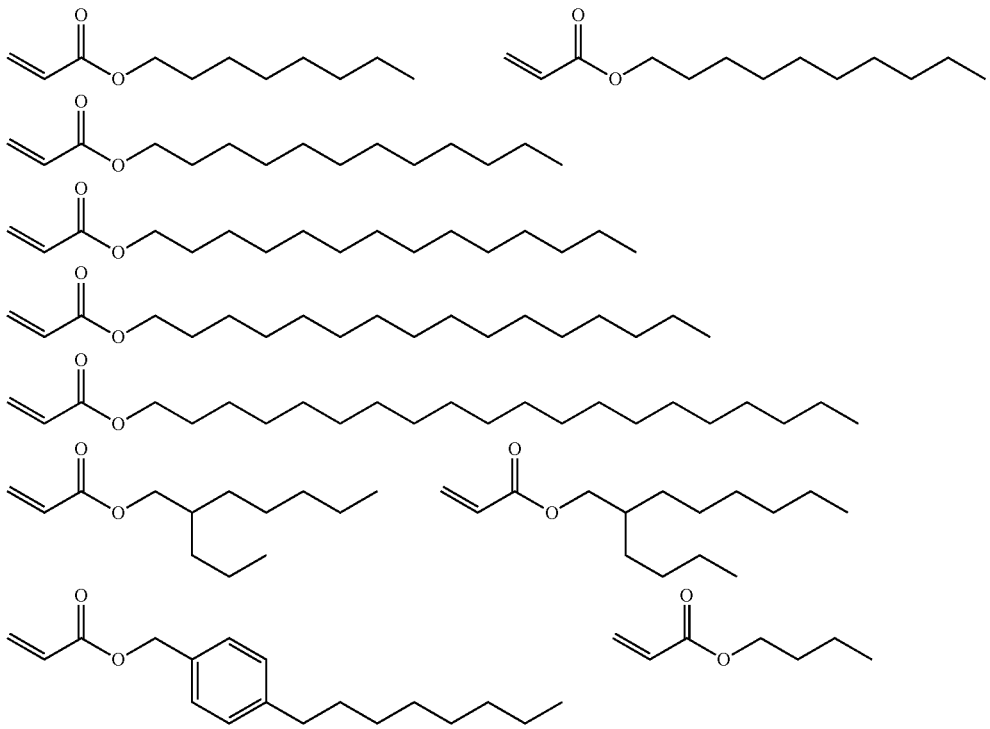

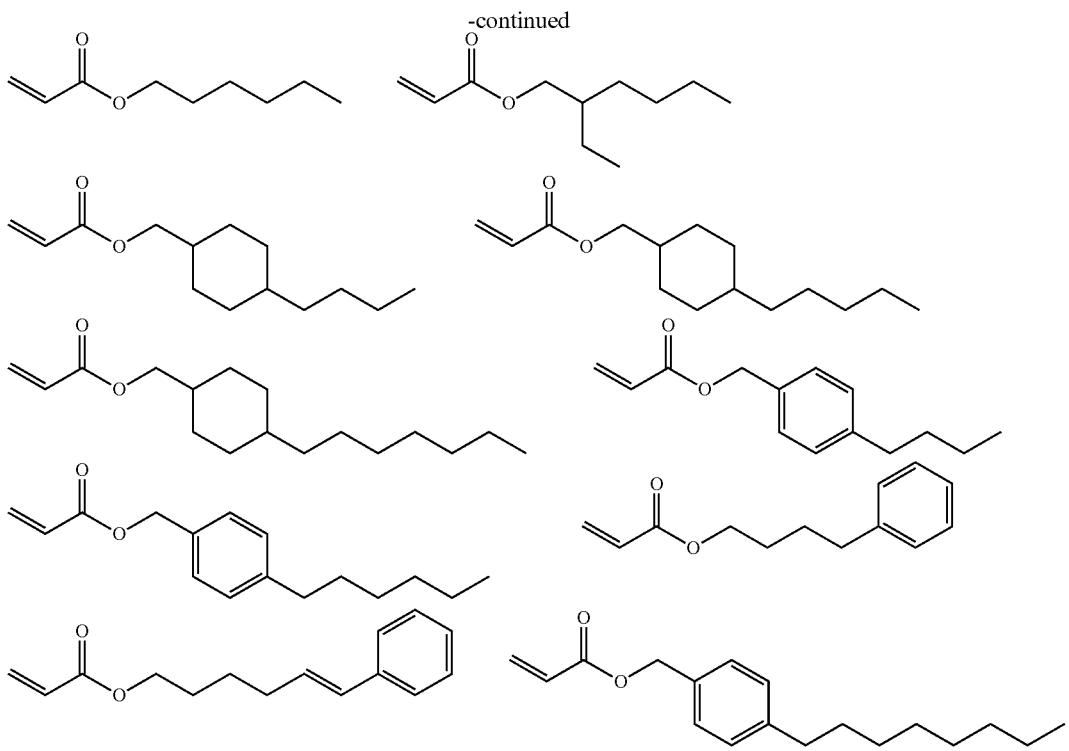

From the viewpoint of photocuring properties, the monofunctional polymerizable compound is preferably a monofunctional (meth)acrylate compound, and from the viewpoint of a reaction rate, it is more preferably a monofunctional acrylate compound.

From the viewpoint of dry etching resistance, the monofunctional polymerizable compound is preferably a monofunctional (meth)acrylate compound having at least one selected from an aromatic structure and an alicyclic hydrocarbon structure, and more preferably a monofunctional (meth)acrylate compound having an aromatic structure.

From the viewpoint of lowering the Onishi parameter, the monofunctional polymerizable compound is preferably a monofunctional (meth)acrylate compound not including an oxygen atom in the groups other than the (meth)acryloyloxy group, and more preferably a monofunctional (meth)acrylate compound in which the groups other than the (meth)acryloyloxy group are formed of only carbon atoms and hydrogen atoms.

Furthermore, from the viewpoint of lowering the proportion of the polymerizable compound including an aliphatic ring having a crosslinked structure with respect to all the polymerizable compounds included in the first curable composition, the monofunctional polymerizable compound is preferably a monofunctional (meth)acrylate compound not including an aliphatic ring having a crosslinked structure.

—Bifunctional or Higher Polymerizable Compound—

As the bifunctional or higher polymerizable compound, a compound having two or more ethylenically unsaturated bond-containing groups is preferable. Examples of the compound having two or more ethylenically unsaturated bond-containing groups include diethylene glycol monoethyl ether (meth)acrylate, dimethylol dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, aryloxypolyethylene glycol acrylate, 1,9-nonanediol di(meth)acrylate, EO-modified bisphenol A di(meth)acrylate, propylene oxide (hereinafter referred to as "PO")-modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, PO-modified neopentyl glycol diacrylate, caprolactone-modified hydroxypivalic acid esterneopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethylol tricyclodecane di(meth)acrylate, neopentyl glycol-modified trimethylol propane di(meth)acrylate, tripropylene glycol di(meth)acrylate, EO-modified tripropylene glycol di(meth)acrylate, trilycerol di(meth)acrylate, dipropylene glycol di(meth)acrylate, divinylethylene urea, divinylpropylene urea, orthoxylylene di(meth)acrylate, metaxylylene di(meth)acrylate, paraxylylene di(meth)acrylate, 1,3-adamantane di(meth)acrylate, norbornane dimethanol di(meth)acrylate, 1,3-phenylene bis(methylene) di(meth)acrylate, 1,3-adamantanediol di(meth)acrylate, 1,6-hexanediol di(meth)acrylate, neopentyl glycol di(meth)acrylate, and ethylene glycol di(meth)acrylate.

Furthermore, as the bifunctional or higher polymerizable compound, a bi- to hexafunctional (meth)acrylate compound having at least one selected from an aromatic structure and an alicyclic hydrocarbon structure can also be used. Examples thereof include a polyfunctional (meth)acrylate compound containing an aromatic group (preferably a phenyl group or a naphthyl group) and having 2 to 4 (meth)acrylate groups. Specific examples thereof include compounds set forth below.

From the viewpoint of photocuring properties, the bifunctional or higher polymerizable compound is preferably a bifunctional or higher (meth)acrylate compound, and from the viewpoint of a reaction rate, it is more preferably a bifunctional or higher acrylate compound.

From the viewpoint of dry etching resistance, the bifunctional or higher polymerizable compound is preferably the bifunctional or higher (meth)acrylate compound having at least one selected from an aromatic structure and an alicyclic hydrocarbon structure, and more preferably a bifunctional or higher (meth)acrylate compound having an aromatic structure.

From the viewpoint of lowering the Onishi parameter, the bifunctional or higher polymerizable compound is preferably a monofunctional (meth)acrylate compound not including an oxygen atom in the groups other than the (meth)acryloyloxy group, and more preferably a monofunctional (meth)acrylate compound in which the groups other than the (meth)acryloyloxy group are formed of only carbon atoms and hydrogen atoms.

In addition, from the viewpoint of lowering the proportion of the polymerizable compound including an aliphatic ring having a crosslinked structure with respect to all the polymerizable compounds included in the first curable composition, the bifunctional or higher polymerizable compound is preferably a bifunctional or higher (meth)acrylate compound not including an aliphatic ring having a crosslinked structure.

—Mixing Ratio of Polymerizable Compounds—

In the first curable composition, the polymerizable compound may be used singly or in combination of two or more kinds thereof.

The proportion of the monofunctional polymerizable compound having one polymerizable group in the polymerizable compound with respect to the total mass of the polymerizable compound is preferably 50% by mass or less, more preferably 40% by mass or less, and particularly preferably 35% by mass or less. The lower limit is preferably 5% by mass or more, and more preferably 10% by mass or more. In a case where the content of the monofunctional polymerizable compound is low, it is easy to raise the Tg of the first layer, and thus, it is easy to set the Tg of the first layer to 90° C. or higher. As a result, it is easy to lower the ΔLWR.

The proportion of the polymerizable compound having 2 to 4 (preferably 2 or 3, and more preferably 2) polymerizable groups in the polymerizable compound is preferably 50% by mass or more, more preferably 60% by mass or more, and particularly preferably 70% by mass or more, with respect to the total mass of the polymerizable compound. The upper limit can be set to 100% by mass. In a case where the content of the polymerizable compound having 2 to 4 polymerizable groups is high, it is easy to raise the Tg of the first layer, and thus, it is easy to set the Tg of the first layer to 90° C. or higher. As a result, it is easy to lower the ΔLWR.

In the present invention, the proportion of the polymerizable compound including an aliphatic ring having a crosslinked structure is preferably less than 30% by mass, more preferably 25% by mass or less, particularly preferably 15% by mass or less, more particularly preferably 5% by mass or less, and still more particularly preferably 0.1% by mass or less, with respect to all the polymerizable compounds (total mass of the polymerizable compounds) included in the first curable composition. In a case where the proportion of the polymerizable compound including an aliphatic ring having a crosslinked structure is less than 30% by mass, it is easy to lower the ΔLWR. Although not being bound to any theory, in a case where the proportion of the polymerizable compound including an aliphatic ring having a crosslinked structure is low, it is considered that in the cured film of the first curable composition to be generated, it is difficult for a portion in which the polymerizable compound becomes sparse by steric hindrance to be generated, and is thus hardly swollen.

Specific examples of the aliphatic ring having a crosslinked structure include the following structures.

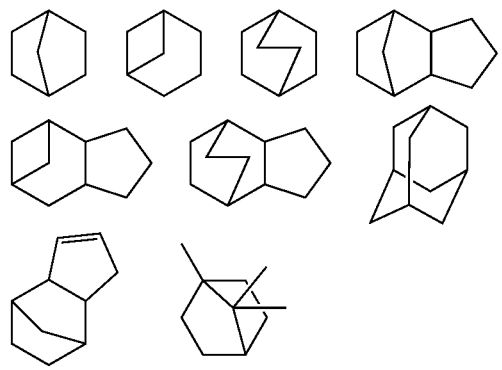

Specific examples of the polymerizable compound including an aliphatic ring having a crosslinked structure include the following ones.

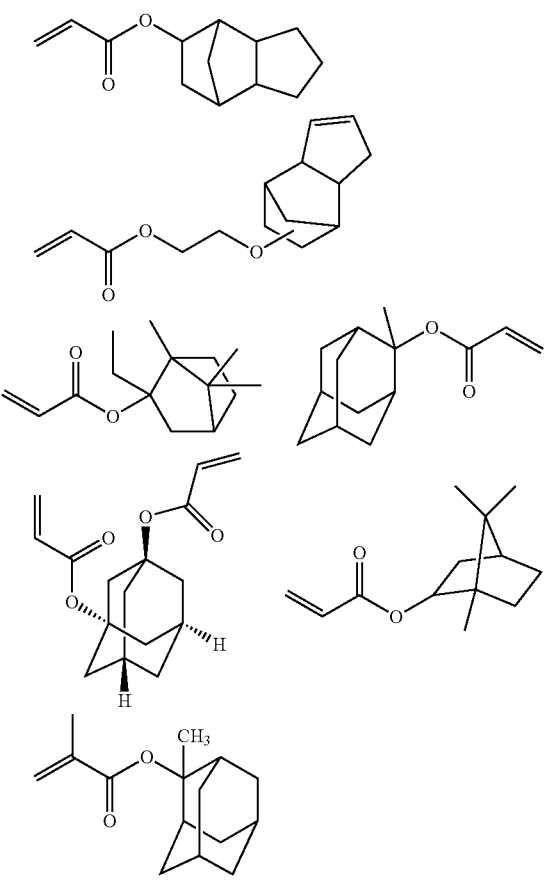

(Photopolymerization Initiator)

The first curable composition preferably includes a photopolymerization initiator. As the photopolymerization initiator, any compound capable of generating active species that polymerize the above-mentioned polymerizable compound by light irradiation can be used without limitation. As the photopolymerization initiator, a photoradical polymerization initiator or a photocationic polymerization initiator is preferable, and a photoradical polymerization initiator is more preferable.

As the photoradical polymerization initiator, for example, commercially available photoradical polymerization initiators may be used. As examples thereof, for example, those described in paragraph No. 0091 of JP2008-105414A can be preferably adopted. Among these, an acetophenone-based compound, an acylphosphine oxide-based compound, and an oxime ester-based compound are preferable from the viewpoints of curing sensitivity and absorption characteristics. Examples of the commercially available products include IRGACURE (registered trademark) 1173, IRGACURE 184, IRGACURE 2959, IRGACURE 127, IRGACURE 907, IRGACURE 369, IRGACURE 379, LUCIRIN (registered trademark) TPO, IRGACURE 819, IRGACURE OXE01, IRGACURE OXE02, IRGACURE 651, and IRGACURE 754 (all manufactured by BASF Corporation).

Furthermore, as the commercially available photoradical polymerization initiator, DAROCUR (registered trademark) 1173 (manufactured by BASF Corporation) may be used.

In the present invention, an oxime compound having a fluorine atom may also be used as the photopolymerization initiator. Specific examples of the oxime compound having a fluorine atom include the compounds described in JP2010-262028A, the compounds 24 and 36 to 40 described in JP2014-500852A, and the compound (C-3) described in JP2013-164471A. The contents of the publications are incorporated herein by reference in their entirety.

Although one type of photopolymerization initiator may be used alone, it is also preferable to use two or more types of photopolymerization initiators in combination. In a case of using two or more types, it is more preferable to use two or more types of the photopolymerization initiators in combination. Specifically, a combination of DAROCURE 1173 and IRGACURE 819, DAROCURE 1173 and IRGACURE OXE01, IRGACURE 1173 and IRGACURE 907, IRGACURE 1173 and LUCIRIN TPO, IRGACURE 1173 and IRGACURE 819, IRGACURE 1173 and IRGACURE OXE01, IRGACURE 907 and LUCIRIN TPO, or IRGACURE 907 and IRGACURE 819 is exemplified. By adopting such a combination, an exposure margin can be expanded.

The content of the photopolymerization initiator is preferably 0.01% to 10% by mass, more preferably 0.1% to 5% by mass, particularly preferably 0.5% to 5% by mass, and more particularly preferably 1% to 4% by mass, with respect to the mass of the first curable composition. The first curable composition may include only one kind or two or more kinds of photopolymerization initiator. In a case where two or more kinds of photopolymerization initiators are included, the total amount thereof preferably falls within the range.

(Mold Release Agent)

The first curable composition preferably includes a mold release agent. The type of the mold release agent is not particularly limited as long as it does not depart from the spirit of the present invention. The mold release agent preferably refers to a material segregating at the interface with a mold and having a function of accelerating a release from the mold. Specific examples thereof include a surfactant, and a non-polymerizable compound having at least one hydroxyl group at the terminal or having a polyalkylene glycol structure in which the hydroxyl group is etherified and substantially not containing fluorine atoms and silicon atoms (hereinafter also referred to as a non-polymerizable compound having releasability).

As the mold release agent, for example, a commercially available mold release agent can be employed. For example, examples of the commercially available product include Polypropylene Glycol (manufactured by Wako Pure Chemical Industries, Ltd.) and FSO-100 (manufactured by E.I. du Pont de Nemours and Company).

The content of the mold release agent is preferably 0.1% to 20% by mass, more preferably 0.2% to 15% by mass, and particularly preferably 0.5% to 10% by mass in the first curable composition excluding the solvent. The first curable composition may include only one kind or two or more kinds of mold release agents. In a case where two or more kinds of mold release agents are included, the total amount thereof preferably falls within the range.

(Surfactant)

As the surfactant, a non-ionic surfactant is preferable.

The nonionic surfactant is a compound which has at least one hydrophobic portion and at least one nonionic hydrophilic portion. The hydrophobic portion and the hydrophilic portion may each be at the terminal of a molecule or inside the molecule. The hydrophobic portion is preferably constituted with a hydrophobic group selected from a hydrocarbon group, a fluorine-containing group, and a Si-containing group, and the number of carbon atoms in the hydrophobic portion is preferably 1 to 25, more preferably 2 to 15, particularly preferably 4 to 10, and more particularly preferably 5 to 8. The nonionic hydrophilic portion preferably has at least one group selected from the group consisting of an alcoholic hydroxyl group, a phenolic hydroxyl group, an ether group (preferably a polyoxyalkylene group or a cyclic ether group), an amido group, an imido group, a ureido group, a urethane group, a cyano group, a sulfonamido group, a lactone group, a lactam group, and a cyclocarbonate group. The nonionic surfactant may be any one of a hydrocarbon-based nonionic surfactant, a fluorine-based nonionic surfactant, a Si-based nonionic surfactant, and a fluorine/Si-based nonionic surfactant, and is preferably a fluorine-based or Si-based nonionic surfactant, and more preferably a fluorine-based nonionic surfactant. Here, the "fluorine/Si-based nonionic surfactant" refers to one satisfying both the requirements for a fluorine-based nonionic surfactant and a Si-based nonionic surfactant.

Examples of the commercially available product of the fluorine-based nonionic surfactant include FLUORAD (registered mark) FC-4430 and FC-4431 manufactured by Sumitomo 3M Limited, SURFLON (registered mark) S-241, S-242, and S-243 manufactured by Asahi Glass Co., Ltd., EFTO (registered mark) EF-PN31M-03, EF-PN31M-04, EF-PN31M-05, EF-PN31M-06, and MF-100 manufactured by Mitsubishi Materials Electronic Chemicals Co., Ltd., POLYFOX PF-636, PF-6320, PF-656, and PF-6520 manufactured by OMNOVA Solutions, Inc., FTERGENT (registered mark) 250, 251, 222F, and 212M DFX-18 manufactured by NEOS Co., Ltd., UNIDYNE (registered mark) DS-401, DS-403, DS-406, DS-451, and DSN-403N manufactured by Daikin Industry Co., Ltd., MEGAFACE (registered mark) F-430, F-444, F-477, F-553, F-556, F-557, F-559, F-562, F-565, F-567, F-569, and R-40 manufactured by DIC Corporation, and Capstone FS-3100 and Zonyl FSO-100 manufactured by E.I. du Pont de Nemours and Company.

In a case where the first curable composition contains a surfactant, the content of the surfactant is preferably 0.1% to 10% by mass, more preferably 0.2% to 5% by mass, and particularly preferably 0.5% to 5% by mass, in the entire first curable composition excluding the solvent. The first curable composition may include only one kind or two or more kinds of surfactants. In a case where two or more kinds of surfactants are included, the total amount thereof preferably falls within the range.

In addition, in the present invention, an aspect in which the first curable composition substantially does not contain a surfactant is also available. The expression, substantially not containing a surfactant, means, for example, that the content of the surfactant is preferably 0.01% by mass or less, and more preferably 0.005% by mass or less, in the entire first curable composition excluding the solvent, and particularly preferably, the surfactant is not contained at all in the first curable composition.

(Non-Polymerizable Compound Having Releasability)

The first curable composition may include a non-polymerizable compound which has a polyalkylene glycol structure having, at the terminal thereof, at least one hydroxyl group or an etherified hydroxyl group, and substantially does not contain a fluorine atom and a silicon atom (non-polymerizable compound having releasability). Here, the non-polymerizable compound refers to a compound not having a polymerizable group. Further, substantially not containing a fluorine atom and a silicon atom denotes, for example, that the total content of the fluorine atoms and the silicon atoms is 1% by mass or less, and preferably denotes that there is neither a fluorine atom nor a silicon atom. By inclusion of neither fluorine atom nor silicon atom, the compatibility with a polymerizable compound is improved, and in particular, in the first curable composition not containing a solvent, the coating uniformity, the pattern formability during an imprint, and the line edge roughness after dry etching are improved.

The polyalkylene glycol structure included in the non-polymerizable compound having releasability is preferably a polyalkylene glycol structure containing an alkylene group having 1 to 6 carbon atoms, more preferably a polyethylene glycol structure (also referred to as a polyethylene oxide structure), a polypropylene glycol structure, a polybutylene glycol structure, or a mixed structure thereof, particularly preferably a polyethylene glycol structure, a polypropylene glycol structure, or a mixed structure thereof, and more particularly preferably a polypropylene glycol structure.

Moreover, the non-polymerizable compound having releasability may be constituted substantially only with a polyalkylene glycol structure, excluding a terminal substituent. Here, the expression, being constituted substantially only with a polyalkylene glycol structure, means that the content of the constituents other than the polyalkylene glycol structure is 5% by mass or less, and preferably 1% by mass or less, of all the constituents. In particular, it is more preferable that a compound constituted substantially only with a polypropylene glycol structure is included as the non-polymerizable compound having releasability.

The polyalkylene glycol structure preferably has 3 to 100 alkylene glycol constitutional units, more preferably 4 to 50 alkylene glycol constitutional units, still more preferably 5 to 30 alkylene glycol constitutional units, and the most preferably 6 to 20 alkylene glycol constitutional units.

The non-polymerizable compound having releasability preferably has, at the terminal thereof, at least one hydroxyl group or an etherified hydroxyl group. In a case where the non-polymerizable compound having releasability has, at the terminal thereof, at least one hydroxyl group or an etherified hydroxyl group, any of the non-polymerizable compounds having releasability in which the residual terminals are hydroxyl groups or a hydrogen atom of the terminal hydroxyl group is substituted may also be used. As the group in which a hydrogen atom of the terminal hydroxyl group may be substituted, an alkyl group (that is, a polyalkylene glycol alkyl ether) or an acyl group (that is, a polyalkylene glycol ester) is preferable, and polyalkylene glycol which has hydroxyl groups at all terminals is more preferable. A compound having a plurality of (preferably 2 or 3) polyalkylene glycol chains each bonded via a linking group can also be preferably used.

Specific preferred examples of the non-polymerizable compound having releasability include polyethylene glycol and polypropylene glycol (for example, manufactured by Wako Pure Chemical Industries, Ltd.); mono- or dimethyl ethers thereof, mono- or dibutyl ethers, mono- or dioctyl ethers, mono- or dicetyl ethers, monostearic acid esters, monooleic acid esters, polyoxyethylene glyceryl ethers, and polyoxypropylene glyceryl ethers; and trimethyl ethers thereof.

The weight-average molecular weight of the non-polymerizable compound having releasability is preferably 150 to 6,000, more preferably 200 to 3,000, particularly preferably 250 to 2,000, and more particularly preferably 300 to 1,200.

In addition, examples of the non-polymerizable compound having releasability can be used in the present invention include a non-polymerizable compound having releasability acetylenediol structure. Examples of the commercially available product of such a non-polymerizable compound having releasability include OLFINE E1010.

In a case where the first curable composition contains a non-polymerizable compound having releasability, the content of the non-polymerizable compound having releasability is preferably 0.1% to 20% by mass, more preferably 0.2% to 15% by mass, and particularly preferably 0.5% to 10% by mass, in the entire first curable composition excluding the solvent. The first curable composition may include only one kind or two or more kinds of non-polymerizable compound having releasability. In a case where two or more kinds of non-polymerizable compounds having releasability are included, the total amount thereof preferably falls within the range.

Furthermore, an aspect in which the first curable composition substantially does not contain the non-polymerizable compound is also available. The expression, that the first curable composition substantially does not contain the non-polymerizable compound, means, for example, that the content of the non-polymerizable compound is preferably 0.01% by mass or less, and more preferably 0.005% by mass or less, in the entire first curable composition excluding the solvent. Particularly preferably, the first curable composition does not contain the non-polymerizable compound at all.

An aspect in which the first curable composition substantially does not include a polymer component other than the non-polymerizable compound having releasability is also available.

(Sensitizer)

In addition to the photopolymerization initiator, a sensitizer may be added to the first curable composition. In a case where the first curable composition for imprints is hard to cure under an oxygen atmosphere, the curability can be improved by blending a sensitizer into the composition.

Preferred examples of the sensitizer include compounds belonging to the following compounds and having an absorption maximum wavelength in the region of 350 nm to 450 nm. Polynuclear aromatics (for example, pyrene, perylene, triphenylene, anthracene, and phenanthrene), xanthenes (for example, fluorescein, eosin, erythrosine, rhodamine B, and rose bengal), xanthones (for example, xanthone, thioxanthone, dimethylthioxanthone, diethylthioxanthone, 2-isopropylthioxanthone, and 2-chlorothioxanthone), cyanines (for example, thiacarbocyanine and oxacarbocyanine), merocyanines (for example, merocyanine and carbomerocyanine), rhodacyanines, oxonols, thiazines (for example, thionine, methylene blue, and toluidine blue), acridines (for example, acridine orange, chloroflavin, acriflavine, and benzoflavin), acridones (for example, acridone and 10-butyl-2-chloroacridone), anthraquinones (for example, anthraquinone and 9,10-dibutoxyanthracene), squaryliums (for example, squarylium), styryls, base styryls, coumarins (for example, 7-diethylamino-4-methylcoumarin and ketocoumarin), carbazoles (for example, N-vinylcarbazole), camphorquinones, and phenothiazines.

In addition, typical examples of the sensitizers that can be used in the present invention include those disclosed in J. V. Crivello, Adv. In Polymer Sci., 62, 1 (1984).

Preferred specific examples of the sensitizer include pyrene, perylene, acridine orange, thioxanthone, 2-chlorothioxanthone, benzoflavin, N-vinylcarbazole, 9,10-dibutoxyanthracene, anthraquinone, coumarin, ketocoumarin, phenanthrene, camphorquinone, and phenothiazines. Further, in the present invention, the compounds described in paragraphs 0043 to 0046 of JP4937806B and paragraph 0036 of JP2011-3916A can also preferably be used as the sensitizer.

In a case where the first curable composition contains a sensitizer, the content of the sensitizer is preferably 30 to 200 parts by mass with respect to 100 parts by mass of the photopolymerization initiator. The first curable composition may include one kind or two or more kinds of sensitizers. In a case where two or more kinds of sensitizers are included, the total amount thereof preferably falls within the range.

(Other Components)

In addition to the above-mentioned components, the first curable composition may include a polymerization inhibitor (for example, a 4-hydroxy-2,2,6,6-tetramethylpiperidine-1-oxyl free radical), an ultraviolet absorber, a solvent, and the like within the scope not departing from the spirit of the present invention. Only one kind or two or more kinds of these compounds may be included. With regard to details thereof, reference can be made to the descriptions in paragraphs 0061 to 0064 of JP2014-170949A, the contents of which are incorporated herein by reference.

Furthermore, an aspect in which the first curable composition substantially does not contain a non-polymerizable compound (a non-polymerizable compound having preferably a weight-average molecular weight of more than 1,000, more preferably a weight-average molecular weight of more than 2,000, and particularly preferably a weight-average molecular weight of 10,000 or more). The expression, substantially not containing a non-polymerizable compound, means, for example, that the content of the non-polymerizable compound is preferably 0.01% by mass or less, and more preferably 0.005% by mass or less. Particularly preferably, the first curable composition does not contain the non-polymerizable compound at all.

<<Step of Forming First Layer by Imprint Method>>

The first curable composition may be filtered before use. For filtration, for example, a polytetrafluoroethylene (PTFE) filter can be used. The pore size is preferably 0.003 µm to 5.0 µm. With regard to the details of filtration, reference can be made to the descriptions in paragraph 0070 of JP2014-170949A, the contents of which are incorporated herein by reference.

The first curable composition preferably forms a first layer as a photocured product. Specifically, the first layer is preferably used by forming a pattern by a photoimprint method.

It is preferable that the first curable composition is applied on an object to be processed or a mold, and the first curable composition is irradiated with light in a state where the first curable composition is sandwiched between the mold and the object to be processed.

The application method is not particularly limited, and reference can be made to the descriptions in paragraph 0102 of JP2010-109092A (whose corresponding US publication is US2011/0199592A), the contents of which are incorporated herein by reference. In the present invention, a spin coating method or an ink jet method is preferable, and the ink jet method is more preferable.

It is preferable that the first curable composition is irradiated with light in a state where the first curable composition is sandwiched between the mold and the object to be processed. The mold is not particularly limited, and reference can be made to the descriptions in paragraphs 0105 to 0109 of JP2010-109092A (whose corresponding US publication is US2011/0199592A), the contents of which are incorporated herein by reference. In the present invention, a quartz mold is preferable. The mold for use in the present invention is preferably a mold having a pattern with a size (line width) of preferably 500 nm or less, more preferably 100 nm or less, particularly preferably 50 nm or less, and more particularly preferably 30 nm or less.

The step in which the first curable composition is sandwiched between the object to be processed and the mold can be preferably carried out under a rare gas atmosphere, a reduced pressure atmosphere, or a reduced pressure rare gas atmosphere. Here, the reduced pressure atmosphere means a state in a space that is fulfilled at a pressure lower than the atmospheric pressure (101,325 Pa), and is preferably 1,000 Pa or less, more preferably 100 Pa or less, and particularly preferably 1 Pa or less. In a case of using a rare gas, helium is preferable. The exposure dose is preferably in the range of 5 mJ/cm$^2$ to 1,000 mJ/cm$^2$.

The first curable composition is preferably cured by further heating after irradiation with light.

In addition to the foregoing, with regard to the details of forming a first layer by an imprint method, reference can be made to the descriptions in paragraph Nos. 0103 to 0115 of JP2010-109092A (whose corresponding US publication is US2011/0199592A), the contents of which are incorporated herein by reference. Further, other specific examples of the step of forming a first layer by an imprint method include those described in paragraph Nos. 0125 to 0136 of JP2012-169462A, the contents of which are incorporated herein by reference.

<Step of Forming Second Layer on First Layer>

The method for producing a pattern laminate of the present invention includes a step of forming a second layer on the first layer. The step of forming a second layer is not particularly limited. Examples thereof include a step of forming a second layer by curing the second curable composition and a step of forming a second layer by sputtering, vapor deposition, or the like.

<<Second Curable Composition>>

In the present invention, it is preferable that the step of forming a second layer includes a step of forming a second layer by curing the second curable composition.

The second curable composition for use in the present invention is not particularly limited in terms of its type as long as it does not depart from the spirit of the present invention.

In the present invention, it is preferable that the second layer includes a Si atom-containing compound or a metal in order to secure the etching selectivity to the first layer.

(Si Atom-Containing Compound)

An aspect in which the second layer includes a Si atom-containing compound will be described.

The second curable composition preferably includes a Si atom-containing compound.

The Si atom-containing compound may be either a monomer or a polymer. Examples of the Si atom-containing compound include a compound having at least one selected from an alkylsilyl group, an alkoxysilyl group, a chained siloxane structure, a cyclic siloxane structure, and a long siloxane structure.

The Si atom-containing compound is preferably a silicone compound having a polysiloxane structure.

The Si atom-containing compound is more preferably a polymer having a structure derived from having a monomer having a chained siloxane structure and an ethylenically unsaturated bond-containing group (preferably a (meth) acrylate monomer having a chained siloxane structure) as a constitutional unit.

Specific examples of the monomer having a chained siloxane structure and an ethylenically unsaturated bond-containing group include acryloxymethylpentamethyl disiloxane and acryloxymethyl bis(trimethylsiloxy)methylsilane. Further, the compounds described in paragraphs Nos. 0020 to 0028 of JP2012-231073A can also be used.

The Si atom-containing compound may also be a polymer including a "monomer having a chained siloxane structure and an ethylenically unsaturated bond-containing group" and a constitutional unit derived from other monomers copolymerizable therewith. Examples of such other monomers include the polymerizable compounds described for the first curable composition as described above.

Preferred examples of the Si atom-containing compound include the following.

(1) A copolymer of an acryloxymethylpentamethyl disiloxane, isobornyl acrylate, and ethylene glycol diacrylate.

(2) A copolymer of acryloxymethyl bis(trimethylsiloxy) methylsilane, isobornyl acrylate, and ethylene glycol diacrylate.

As the Si atom-containing compound, a commercially available product thereof can also be used. Examples of the commercially available Si atom-containing compound include trade name Z-6018 (phenylpropyl-based silicone resin, manufactured by Toray Dow Corning Co., Ltd.).

The second curable composition preferably contains 5% to 50% by mass of the Si atom-containing compound, and more preferably contains 10% to 30% by mass of the Si atom-containing compound, in the entire second curable composition excluding the solvent (corresponding to the mass the dried second layer, and also referred to as the total solid content). In the second curable composition, the Si atom-containing compound may be used singly or in combination of two or more kinds thereof. In a case where two or more kinds of the Si atom-containing compounds are used, the total amount thereof preferably falls within the range.

(Metal)

An aspect in which the second layer includes a metal will be described.

The aspect in which the second layer includes a metal is preferable in a case where vapor deposition or sputtering is used for formation of the second layer.

Examples of the metal that can be preferably used for the second layer include copper, tungsten, titanium, and ruthenium.

(Other Components)

The second curable composition may further include a crosslinking agent component such as hexamethoxymethylmelamine.

Incidentally, the second curable composition may further include a curing accelerator component such as toluenesulfonic acid.

(Solvent)

The second curable composition may include a solvent. In the second curable composition, the solvent may be used singly or in combination of two or more kinds thereof.

Regarding the kind of the solvent, any solvent that can dissolve the respective components of the second curable composition therein can be used, but is preferably a solvent having only one or more of an ester structure, a ketone structure, a hydroxyl group, and an ether structure. Specifically, preferred solvents are a singular solvent or mixed solvent selected from propylene glycol monomethyl ether acetate, cyclohexanone, 2-heptanone, gamma-butyrolactone, propylene glycol monomethyl ether, ethyl lactate, and methyl amyl ketone.

Specific preferred examples of the second curable composition include the compositions 2 to 5 described in [0026] to [0048] of JP2014-150263A.

As the second curable composition, a composition including a siloxane referred to as SPIN ON GLASS (SOG) as a main component (component included in the amount of 50% by mass or more) is also preferably used.

<Step of Heating Second Layer>

It is preferable that the method for producing a pattern laminate of the present invention further includes a step of heating the second layer from the viewpoint of accelerating the curing of the second layer. In a case where the second curable composition includes a thermosetting Si atom-containing compound, it is preferable that a step of heating the second layer is included.

In the present invention, since the glass transition temperature of the first layer is 90° C. or higher, it is difficult for the mixing of the first layer and the second layer to occur, and thus, ΔLWR can be reduced even with the step of heating the second layer.

The heating temperature in the step of heating the second layer is, for example, 100° C. to 200° C.

[Pattern Laminate]

The pattern laminate of the present invention includes an object to be processed, a first layer having a pattern positioned on the object to be processed, and a second layer positioned on the first layer, and has a glass transition temperature of the first layer of 90° C. or higher.

Figure 2:
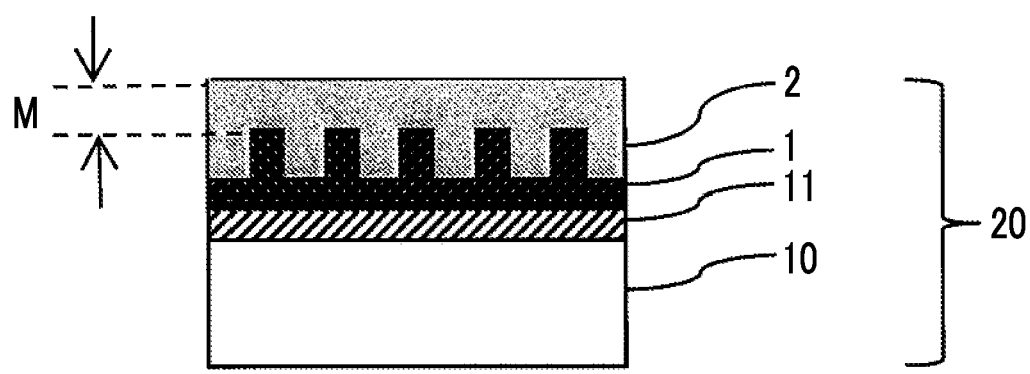
FIG. 2 is a schematic view showing the cross-section of an example of the pattern laminate of the present invention.

FIG. 2 is a schematic view showing the cross-section of an example of the pattern laminate of the present invention.

The pattern laminate 20 of the present invention shown in FIG. 2 has an object 10 to be processed, a first layer 1 positioned on the object 10 to be processed through an adhesion material 11, and a second layer 2 positioned on the first layer 1.

The pattern laminate of the present invention is preferably used for a reversion process as described above. In a case where the pattern laminate of the present invention is used for a reversion process, it is preferable that the second layer 2 has a pattern on a surface on the side of the first layer 1, and it is more preferable that the second layer 2 has a pattern following the pattern that the first layer 1 has. FIG. 2 shows an aspect in which the surface on the side of the first layer 1 has a pattern following the pattern that the first layer 1 has. Specifically, it is preferable that a pattern concave portion of the second layer 2 is present in the position corresponding to a pattern convex portion that the first layer 1 has, and a pattern convex portion of the second layer 2 is present in the position corresponding to a pattern concave portion that the first layer 1 has. However, in a case where an intermediate layer which will be described later is included, the second layer 2 may have a pattern other than the pattern that sufficiently follows the pattern that the first layer 1 has, on a surface on the side of the first layer 1.

Furthermore, the second layer 2 may or may not have a pattern on a surface on the side opposite to the first layer 1.

In FIG. 2, a thickness M for making the second layer thin in a case where the pattern laminate of the present invention is used in the method for producing a reversal pattern is shown.

In FIG. 2, an aspect in which the second layer 2 is directly in contact with the first layer 1 is shown. The pattern laminate of the present invention is not limited to the aspect shown in FIG. 2, and an intermediate layer (not shown) may be present between the first layer 1 and the second layer 2. Examples of materials that can be preferably used in the intermediate layer include copper, tungsten, titanium, and ruthenium.

<Characteristics of First Layer>
<<Tg of First Layer>>

The first layer has a glass transition temperature of 90° C. or higher. Specifically, the Tg of the first layer which is a cured product obtained by curing the first curable composition is 90° C. or higher. The Tg of the first layer is preferably 100° C. or higher. The Tg of the first layer is a value measured by a method described in Examples which will be described later. In a case where the Tg of the first layer is 90° C. or higher, the mixing of the first layer and the second layer can be suppressed, and thus, ΔLWR can be reduced. In particular, in a case where the Tg of the first layer is 90° C. or higher, the permeation of the components of a second curable composition into the first layer can be suppressed in a case where the second curable composition which will be described later is applied onto the first layer.

<<Selectivity Ratio of First Layer>>

In the present invention, the etching selectivity ratio of the first layer to the second layer is preferably 1.2 to 10, more preferably 1.5 to 4, and particularly preferably 1.6 to 2.15.

<<Thickness of First Layer>>

The thickness of the first layer can be adjusted according to the depth of a mold to be used in the step of forming a first layer by an imprint method. The thickness of the first layer is preferably, for example, 0.001 to 100 µm.

The thickness D of the residual film contained in the first layer shown in FIG. 1 is preferably as low as possible from the viewpoint of a processing shape after etching.

<Characteristics of Second Layer>

The thickness of the second layer can be adjusted by the concentration of solid content in the second curable composition. The thickness of the second layer is preferably, for example, 0.001 to 10 µm.

The thickness M for making the second layer thin shown in FIG. 2 is preferably as low as possible from the viewpoint of a processing shape after etching.

[Method for Producing Reversal Pattern]

The method for producing a reversal pattern of the present invention includes the method for producing a pattern laminate of the present invention, and includes:

a step of making the second layer thin until a region having the pattern of the first layer exposed therein and a region having the first layer and the second layer laminated therein are formed, and a step of forming a reversal pattern by selectively etching the region having the pattern of the first layer exposed therein.

<Step of Making Second Layer Thin>

The method for producing a reversal pattern of the present invention includes a step of making the second layer thin until a region having the pattern of the first layer exposed therein and a region having the first layer and the second layer laminated therein are formed.

In the step of making the second layer thin, for the pattern laminate 20 of the present invention shown in FIG. 2, it is preferable that the second layer 2 is delaminated until a portion of the thickness M for making the second layer thin shown in FIG. 2 is removed.

Figure 3:
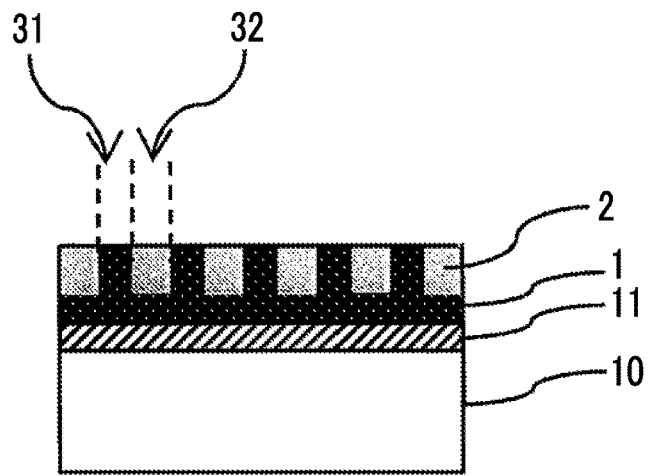
FIG. 3 is a schematic view showing the cross-section of an example of a member obtained by the step of making the second layer thin in the method for producing a reversal pattern of the present invention.

FIG. 3 is a schematic view showing the cross-section of an example of a member obtained by the step of making the second layer thin in the method for producing a reversal pattern of the present invention. A region 31 having the pattern of the first layer exposed therein and a region 32 having the first layer and the second layer laminated therein are present in the member obtained by step of making the second layer thin shown in FIG. 3.

The step of making the second layer thin is not particularly limited, and examples thereof include etching (also referred to as an etch-back step) and chemical mechanical polishing.

In the present invention, it is preferable that the step of making the second layer thin is an etch-back step of etching the second layer.

In the etch-back step, it is more preferable that etching is performed at least until the second layer formed on a pattern convex portion of the first layer is removed.

The etching gas in the etch-back step can be selected according to the type of the second layer. The etching gas in the etch-back step is preferably an F-based gas from the viewpoint of easy etching, in a case where the second layer is a Si atom-containing compound. Examples of the F-based gas include a $CF_4/CHF_3/Ar$ mixed gas.

<Step of Forming Reversal Pattern>

The method for producing a reversal pattern of the present invention includes a step of forming a reversal pattern by selectively etching the region having the pattern of the first layer exposed therein.

Specifically, it is preferable that the pattern convex portion of the first layer is removed by etching. In the member obtained by the step of making the second layer thin shown in FIG. 3, it is preferable that etching is performed by selectively etching a region 31 having the pattern of the first layer, corresponding to the pattern convex portion of the first layer 1, exposed therein.

The etching gas in the etching step for forming the reversal pattern can be selected according to an etching selectivity ratio to the second layer of the first layer. It is preferable that the etching gas in the etching step for forming the reversal pattern is an O-based gas from the viewpoint of etching selectivity (high etching selectivity ratio to the second layer). Examples of the O-based gas include $O_2$ gas.

With regard to the details of the imprint lithography method in addition to the foregoing, reference can be made to the descriptions in JP5439374B and JP2014-150263A, the contents of which are incorporated herein by reference.

According to the method for producing a pattern laminate of the present invention, it is possible to provide a pattern laminate capable of forming a fine pattern with low cost and high accuracy by a photoimprint method. For this reason, a fine pattern which has been formed by using a photolithography technique in the related art can be formed with higher accuracy and at lower cost. For example, the pattern can also be applied as a permanent film such as an overcoat layer and an insulate film used for a liquid crystal display (LCD) or the like, or an etching resist for a semiconductor integrated circuit, a recording material, a flat panel display, or the like. Particularly, the pattern laminate obtained by the method for producing a pattern laminate of the present invention is also excellent in etching resistance, and can also be preferably used as an etching resist for dry etching using fluorocarbon or the like.

In a permanent film (resist for a structural member) for use in a liquid crystal display (LCD) or the like and a resist used for processing a substrate of an electronic material, it is desirable to avoid incorporation of ionic impurities of metals or organic substances into the resist as much as possible in order not to hinder the operation of the product. Therefore, the concentration of ionic impurities of metals or organic substances in the first curable composition or the second curable composition is preferably 1 parts per million (ppm) by mass or less, more preferably 100 parts per billion (ppb) by mass or less, and particularly preferably 10 ppb by mass or less.

<Reversal Pattern>

The reversal pattern formed in accordance with the method for producing a reversal pattern of the present invention as described above can be used as a permanent film for used in a liquid crystal display (LCD) or the like, or as an etching mask for semiconductor processing.

The reversal pattern can be preferably used for manufacture of, for example, a semiconductor integrated circuit, a microelectromechanical system (MEMS), or a recording medium such as an optical disk and a magnetic disk; an optical device including, for example, a light-receiving element such as a solid-state imaging device, and a light emitting element such as an LED and an organic electroluminescence (EL); an optical component such as a diffraction grating, a relief hologram, an optical waveguide, an optical filter, and a microlens array; a member for flat panel displays such as a thin-film transistor, an organic transistor, a color filter, an antireflection film, a polarizing element, an optical film, and a pillar material; a nanobio device; an immunoassay chip; a deoxyribonucleic acid (DNA) separation chip; a microreactor, a photonic liquid crystal; and a guide pattern for fine pattern formation (directed self-assembly: DSA) using self-organization of a block copolymer.

A method in which the reversal pattern is used as an etching mask for processing a semiconductor will be described.

The object to be processed on the underlayer thereof is etched using the reversal pattern as an etching mask such that the reversal pattern is transferred onto the object to be processed. With regard to such the method, reference can be made to JP1993-267253A (JP-H05-267253A), JP2002-110510A, and paragraphs 0016 to 0030 of JP2006-521702A, the contents of which are incorporated herein by reference.

Figure 4:
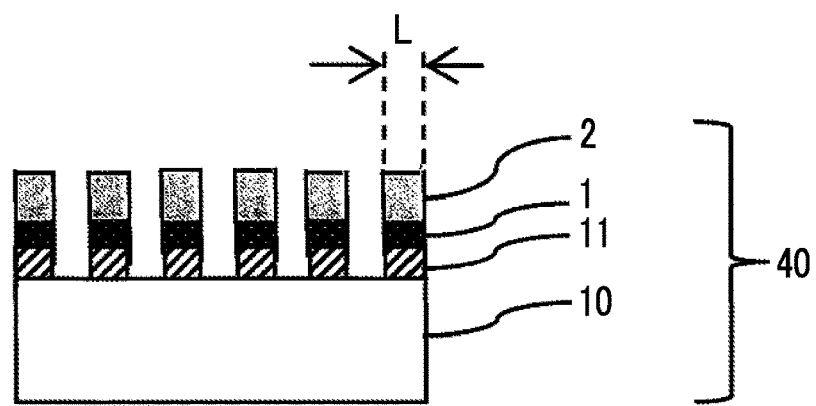
FIG. 4 is a schematic view showing the cross-section of an example of a reversal pattern obtained by the step of forming a reversal pattern in the method for producing a reversal pattern of the present invention.

The convex portion of the reversal pattern 40 shown in FIG. 4 is present at a position corresponding to the concave portion of a member obtained by the step of forming a first layer having a pattern on an object to be processed shown in FIG. 1. Further, the concave portion of the reversal pattern 40 shown in FIG. 4 is present at a position corresponding to the convex portion of a member obtained by the step of forming a first layer having a pattern on an object to be processed shown in FIG. 1. The object to be processed can be processed using the reversal pattern 40 having the second layer 2 in FIG. 4 present on a surface thereof as a mask.

Figure 5:
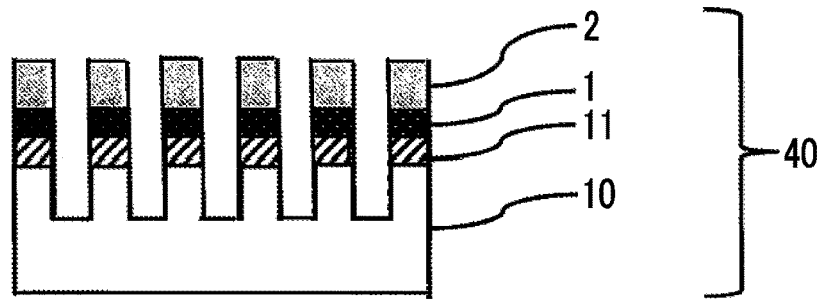
FIG. 5 is a schematic view showing the cross-section of an example of imprint lithography using a reversal pattern obtained by the method for producing a reversal pattern of the present invention.

FIG. 5 is a schematic view showing the cross-section of an example of imprint lithography using a reversal pattern obtained by the method for producing a reversal pattern of the present invention. In the aspect shown in FIG. 5, the object 10 to be processed at a position corresponding to the concave portion of the reversal pattern 40 with the convex portion of the reversal pattern 40 as an etching mask can be etching-processed.

For the member obtained by the step of forming a first layer having a pattern on an object to be processed shown in FIG. 1, the thickness D of the residual film contained in the first layer is present in the concave portion, whereas the reversal pattern shown in FIG. 4 has no residual film present in the concave portion. By using such the reversal pattern having no residual film as an etching mask, processing with good rectangularity can be performed.

A preferred range of the line width L of the reversal pattern (corresponding to the size of the reversal pattern) shown in FIG. 4 is the same as the preferred range of the size (line width) of the mold.

EXAMPLES

Hereinafter, the present invention will be described in more detail with reference to Examples. The materials, the amounts to be used, the ratios, the details of treatments, the procedures of treatments, and the like shown in Examples below may be appropriately modified while not departing from the spirit of the present invention. Therefore, the scope of the present invention is not limited to specific examples set forth below.

Examples 1 to 10 and Comparative Examples 1 to 10

In the following procedure, each of the pattern laminates of Examples and Comparative Examples was produced.

<Step of Forming First Layer Having Pattern on Object to be Processed>

<<Preparation of First Curable Composition>>

A polymerizable compound, a photopolymerization initiator, and a mold release agent shown in Table 3 or 4 were mixed, and 4-hydroxy-2,2,6,6-tetramethylpiperidin-1-oxyl-free radical (by Tokyo Chemical Industry Co. Ltd.) as a polymerization inhibitor was further added thereto in the amount of 200 ppm by mass (0.02% by mass) with respect to the polymerizable compound. The obtained mixed solution was filtered through a 0.1-µm polytetrafluoroethylene (PTFE)-made filter, thereby preparing a first curable composition.

In addition, the amounts of the respective components in Table 3 or 4 are shown in mass ratios.

(Polymerizable Compound)

Details of A-1 to A-11 used as the polymerizable compound are set forth below.

A-1: 1,3-Phenylene bis(methylene)diacrylate (a synthetic product synthesized from α,α'-dichloro-meta-xylene and acrylic acid), Onishi parameter: 3.2.

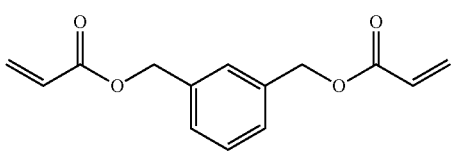 [SMILES: C=CC(=O)OCc1cccc(COC(=O)C=C)c1]

A-2: 1,3-Adamantanediol diacrylate (manufactured by Tokyo Kasei Kogyo Co. Ltd.), Onishi parameter: 3.4.

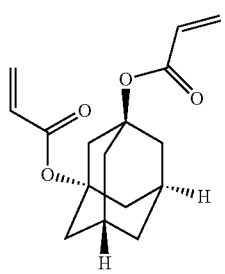 [SMILES: C=CC(=O)O[C@]12C[C@H]3C[C@H](C[C@](OC(=O)C=C)(C3)C1)C2]

A-3: 1,6-Hexanediol diacrylate (manufactured by Shin-Nakamura Chemical Corporation), Onishi parameter: 4.4.

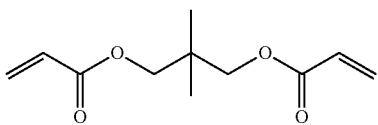

A-4: Neopentyl glycol diacrylate (manufactured by Shin-Nakamura Chemical Corporation), Onishi parameter: 4.3.

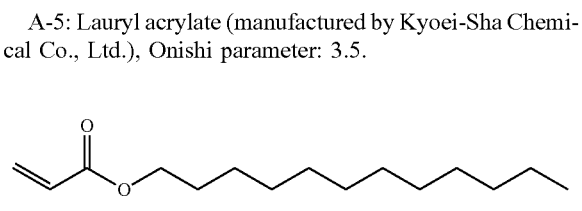

A-5: Lauryl acrylate (manufactured by Kyoei-Sha Chemical Co., Ltd.), Onishi parameter: 3.5.

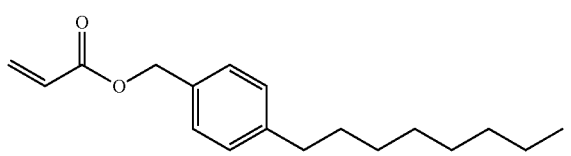 [SMILES: C=CC(=O)OCc1ccc(CCCCCCCC)cc1]

A-6: Synthetic product, Onishi parameter: 2.9.

A-7: Isobornyl acrylate (manufactured by Osaka Organic Chemical Industry Ltd.), Onishi parameter: 3.5.

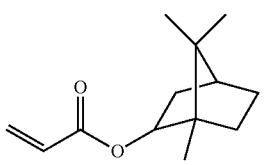

A-8: Synthetic product, Onishi parameter: 3.0.

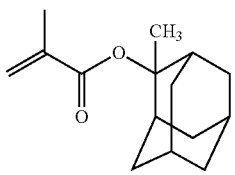 [SMILES: C=C(C)C(=O)OC1(C)C2CC3CC(C2)CC1C3]

A-9: Ethylene glycol diacrylate (manufactured by E.I. du Pont de Nemours and Company), Onishi parameter: 5.5.

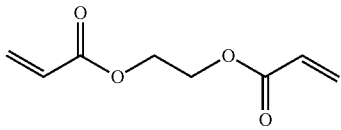

A-10: Cyclohexyl acrylate (manufactured by Osaka Organic Chemical Industry Ltd.), Onishi parameter: 3.6.

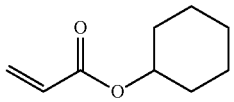

A-11: n-Hexyl acrylate (manufactured by Tokyo Kasei Kogyo Co. Ltd.), Onishi parameter: 3.9.

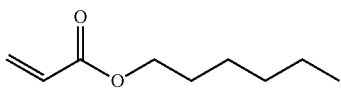

(Photopolymerization Initiator)

Details of B-1 to B-3 used as the photopolymerization initiator are set forth below.

B-1: IRGACURE 819 (manufactured by BASF Corporation).

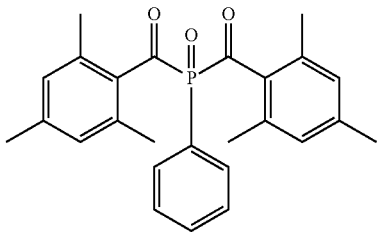

B-2: IRGACURE OXE01 (manufactured by BASF Corporation).

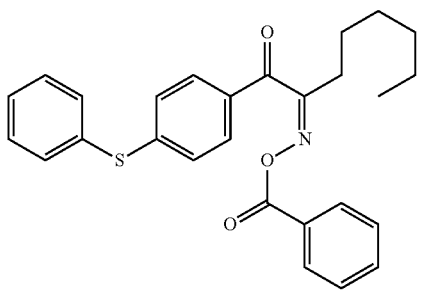 [SMILES: CCCCCC/C(=N/OC(=O)c1ccccc1)C(=O)c1ccc(Sc2ccccc2)cc1]

B-3: DAROCUR 1173 (manufactured by BASF Corporation).

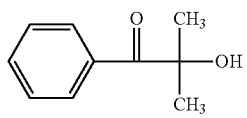

(Mold Release Agent)

Details of C-1 and C-2 used as the mold release agent are set forth below.

C-1: Polypropylene glycol (manufactured by Wako Pure Chemical Industries, Ltd.).

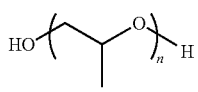

C-2: FSO-100 (manufactured by E.I. du Pont de Nemours and Company), fluorine-containing surfactant having a polyethylene glycol structure.

(Onishi Parameter of First Curable Composition)

The Onishi parameter is a value calculated by the following equation for each of the polymerizable compounds.

Onishi parameter=(Total number of atoms in the polymerizable compound)/{(Number of carbon atoms in the polymerizable compound)−(Number of oxygen atoms in the polymerizable compound)}

In a case where the first curable composition includes only one kind of polymerizable compound, the Onishi parameter of the first curable composition was calculated by the equation.

In a case where the first curable composition includes a plurality of kinds of polymerizable compounds, a sum of values obtained by multiplying the mass ratios of the respective polymerizable compounds by the respective Onishi parameters of the polymerizable compounds was calculated, and used as the Onishi parameters of the first curable composition.

The obtained Onishi parameters of the first curable composition are shown in Table 3 or 4.

(Proportion of Polymerizable Compound Including Aliphatic Ring Having Crosslinked Structure)

The proportion of the polymerizable compound including an aliphatic ring having a crosslinked structure with respect to all the polymerizable compounds included in the first curable composition was calculated. The obtained results are described in Table 3 or 4.

(Measurement of Viscosity)

The viscosity of the first curable composition (before curing) at 23° C. (23±0.2° C.) was measured using a RE-80L type rotary viscometer manufactured by Toki Sangyo Co., Ltd.

The temperature during the measurement was 23° C. and the rotation speed was set to 50 rpm (rotations per minute) in a case where the viscosity reached 6.077 to 12.15 mPa·s. The rotation speed during the measurement in other cases was set to a proper rotation speed in Table 1 according to the viscosity.

TABLE 1

| Viscosity | Proper rotation speed |
| --- | --- |
| 0.001 to 6.076 mPa · s | 100 rpm |
| 6.077 to 12.15 mPa · s | 50 rpm |
| 12.16 to 30.38 mPa · s | 20 rpm |
| 30.39 to 60.76 mPa · s | 10 rpm |
| 60.77 to 121.5 mPa · s | 5 rpm |
| 121.6 to 303.8 mPa · s | 2 rpm |
| 303.9 to 607.6 mPa · s | 1 rpm |
| 607.7 to 1215 mPa · s | 0.5 rpm |
| 1216 to 2025 mPa · s | 0.3 rpm |

The obtained results are described in Table 3 or 4.

(Measurement of Glass Transition Temperature of First Layer)

The first curable composition prepared above was cured by irradiation with a high-pressure mercury lamp at 1,000 mJ/cm² to manufacture a film with a film thickness of 150 μm. The obtained film was used as a precursor (layer having no pattern) of the first layer.

The glass transition temperature of the precursor of the manufactured first layer was measured according to the following procedure.

A strip-shaped sample with a width of 5 mm was cut out from the precursor of the manufactured first layer. The glass transition temperature of the sample was measured by a dynamic viscoelasticity measuring apparatus DMS-6100 (manufactured by Seiko Instruments Inc.). The glass transition temperature was measured at a heating rate of 5° C./minute and a measurement frequency of 1 Hz in a tensile sine wave mode. A temperature taking a maximum value of a loss factor (tan D value) was defined as a glass transition temperature. Further, in a case where there are two or more glass transition temperatures, a temperature in the larger peak surface area at a tan D for calculating the glass transition temperature was adopted. The glass transition temperature of the precursor of the obtained first layer was taken as a glass transition temperature of the first layer which will be described later. The results are shown in Table 3 or 4.

<<Step of Forming First Layer by Imprint Method>>

A silicon wafer was used as an object to be processed. Three types of quartz molds with a line/space, each having a line width of 30 nm, 100 nm, or 500 nm and all having a depth of 60 nm as a mold were used. The first curable composition is applied onto a silicon wafer by an ink jet method, using an inkjet printer DMP-2831 manufactured by FUJIFILM Dimatix Inc. as an ink jet device.

Thereafter, the first curable composition on the silicon wafer was sandwiched between the quartz molds under a helium atmosphere. Further, three types of samples were manufactured using three types of quartz molds. The first curable composition was exposed under the condition of 100 mJ/cm² using a high pressure mercury lamp on a surface of the quartz mold. The quartz mold was released from the exposed first curable composition to obtains a laminate (hereinafter also referred to as a sample) with the object to be processed and the first layer having a pattern. In the sample, the thickness D of the residual film contained the first layer having a pattern was 10 nm, and a pattern with a height corresponding to the mold depth 60 nm on the residual film was formed. Incidentally, in each of Examples and Comparative Examples, three types of samples having a pattern with a size of 30 nm, a pattern with a size of 100 nm, and a pattern with a size of 500 nm, respectively, corresponding to the three types of quartz molds used, were manufactured.

<Step of Forming Second Layer on First Layer>

Moreover, with regard to the three types of samples, a second curable composition including a Si atom-containing compound having the following composition was spin-coated on the first layer having a pattern.

<<Composition of Second Curable Composition>>

| | |
|---|---|
| Hydroxy-functional polysiloxane (trade name Z-6018, manufactured by Toray Dow Corning Co., Ltd., phenylpropyl-based silicone resin) | 4% by mass |
| Hexamethoxymethylmelamine | 0.95% by mass |
| Toluenesulfonic acid | 0.05% by mass |
| Methyl amyl ketone | 95% by mass |

<<Step of Heating Second Layer>>

Thereafter, heating was performed at 150° C. for 1 minute to form a second layer with a thickness of 50 to 100 nm. A laminate of the object to be processed, the first layer having a pattern, and the second layer, as obtained above, was used as a pattern laminate in each of Examples and Comparative Examples. Further, in each of Examples and Comparative Examples, three types of pattern laminates having a pattern with a size of 30 nm, a pattern with a size of 100 nm, and a pattern with a size of 500 nm, respectively, were manufactured.

<Production of Reversal Pattern>

A pattern was produced in the following procedure, using the pattern laminate of each of Examples and Comparative Examples.

The pattern laminate of each of Examples and Comparative Examples was transported to an etching apparatus.

<<Step of Making Second Layer Thin>>

In the step of making the second layer thin, an etch-back step of etching the second layer was performed until a region having the pattern of the first layer exposed therein and a region having the first layer and the second layer laminated therein were formed under the following condition.

A $CF_4/CHF_3/Ar$ mixed gas was selected as an etching gas in the etch-back step and the temperature of the pattern laminate was controlled to 40° C. during the etch-back.

<<Step of Forming Reversal Pattern>>

The region having the pattern of the first layer exposed therein was selectively etched under the following condition until the first pattern disappeared from the region having the pattern of the first layer exposed therein, thereby forming a reversal pattern. Further, in each of Examples and Comparative Examples, reversal patterns having three types of line width, having a pattern with a size of 30 nm, a pattern with a size of 100 nm, and a pattern with a size of 500 nm, respectively, were manufactured from three types of pattern laminates having a pattern with a size of 100 nm, and a pattern with a size of 500 nm, respectively.

An $O_2$ gas was selected as an etching gas in the etching step for forming the reversal pattern, and the temperature of the pattern laminate that had been subjected to etch-back was controlled to 40° C. during the etching.

The etching conditions in the etching step and the step of forming a reversal pattern are set forth in Table 2.

Apparatus: Centura DPS

TABLE 2

| | Etch-back | Step of forming reversal pattern |
|---|---|---|
| Gas pressure (mTorr) | 10 | 10 |
| Ar (sccm) | 30 | — |
| $O_2$ (sccm) | 20 | 20 |
| $CHF_3$ (sccm) | 30 | — |
| Source (W) | 50 | 50 |
| Bias (W) | 50 | 50 |
| Etching time (seconds) | 50 to 100 | 50 to 100 |

In Table 2, 1 Torr equals to 133.322368 Pa. 1 sccm (Standard Cubic Centimeter per Minute) equals to $1.69 \times 10^{-4}$ Pa·m$^3$/sec in a standard state (1 atm=1.013×10 Pa, 0° C.).

The obtained reversal pattern had no residual film since the object to be processed was exposed to the pattern portion of the pattern portion of the first pattern contained in the pattern laminate in each of Examples and Comparative Examples. On the other hand, the reversal pattern had a region having the first layer and the second layer laminated therein on the object to be processed, in the non-pattern portion of the first pattern contained in the pattern laminate in each of Examples and Comparative Examples.

During the etching, the etching rate of the second layer and the etching rate of the first layer were calculated. The ratio of the etching rate of the first layer to the etching rate of the second layer was calculated as a selectivity ratio. The obtained results are described in Table 3 or 4 as an etching selectivity ratio of the first layer relative to the second layer.

[Evaluation]

The three types of reversal patterns manufactured above were observed with a scanning electron microscope (SEM), and ΔLWR and defects thereof were evaluated.

<ΔLWR>

After the etch-back step, the upper surfaces (surfaces on the side opposite to on the object 10 to be processed in FIG. 4) of the pattern before and after etching were observed with SEM (magnification: 100,000 times), and (line width roughness (LWR) was measured from the obtained image. A difference (ΔLWR) between the LWR after etching and the LWR before etching was calculated. The units are nm.

ΔLWR=(LWR after etching)−(LWR before etching)

The values of the obtained ΔLWR were evaluated in accordance with the following standard. ΔLWR is practically required to be evaluated as A or B, and preferably evaluated as A. The obtained results are shown in Table 3 or 4.

A: ΔLWR≤2 nm.
B: 2 nm<ΔLWR≤4 nm.
C: 4 nm<ΔLWR≤6 nm.
D: 6 nm<ΔLWR≤8 nm.
E: ΔLWR>10 nm.

<Defects>

With regard to all the obtained reversal patterns, the patterns (regions having the first layer and the second layer laminated on the object to be processed) were observed with a scanning electron microscope (SEM) at a magnification of 10,000. Thus, the results were evaluated in accordance with the following standard. The defects are practically required to be evaluated as A or B, and are preferably evaluated as A. The obtained results are shown in Table 3 or 4.
A: A good pattern was obtained over the entire surface.
B: Disconnection, collapse, and the like of the pattern were seen in some of the regions.
C: Disconnection, collapse, and the like of the pattern were seen in a wide range of the regions.
D: Disconnection, collapse, and the like of the pattern were seen over the entire surface.

TABLE 3

| | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| First curable composition | Polymerizable compound | A-1 | 70 | 65 | 100 | 80 | 60 | 70 | | | 10 | |
| | | A-2 | | | | | | | 100 | | | |
| | | A-3 | | | | | | | | 85 | | 80 |
| | | A-4 | | | | | | | | | 90 | |
| | | A-5 | 30 | 10 | | | | | | 15 | | |
| | | A-6 | | 25 | | 20 | | | | | | |
| | | A-7 | | | | | 40 | | | | | |
| | | A-8 | | | | | | 30 | | | | 20 |
| | | A-9 | | | | | | | | | | |
| | | A-10 | | | | | | | | | | |
| | | A-11 | | | | | | | | | | |
| | Photopolymerization initiator | B-1 | 2 | | 2 | | 2 | 2 | | 2 | 2 | |
| | | B-2 | | 2 | | 2 | | | 2 | | | 2 |
| | | B-3 | 2 | | | 2 | 2 | 2 | 2 | 2 | 2 | |
| | Mold release agent | C-1 | 3 | | 3 | 3 | 3 | | 3 | 4 | 1 | |
| | | C-2 | | 1 | | | | 3 | | | | 3 |
| | Onishi parameter | | 3.3 | 3.3 | 3.2 | 3.1 | 3.2 | 3.1 | 3.4 | 4 | 3.9 | 3.9 |
| | Proportion [% by mass] of polymerizable compound including aliphatic ring having crosslinked structure | | 0 | 0 | 0 | 0 | 40 | 30 | 100 | 0 | 0 | 20 |
| | Viscosity [mPa · s] at 23° C. | | 7 | 8 | 12 | 10 | 7 | 12 | >15 | 6 | 8 | 7 |
| First layer | Glass transition temperature [° C.] | | 95 | 100 | 160 | 125 | 105 | 110 | 135 | 95 | 90 | 110 |
| | Etching selectivity ratio to second layer | | 2.01 | 2.11 | 1.99 | 1.9 | 1.92 | 1.91 | 2.05 | 2.22 | 2.2 | 2.19 |
| Evaluation | Pattern with size of 30 nm | ΔLWR | A | A | B | A | B | B | B | B | B | B |
| | | Defects | A | A | B | B | A | B | B | B | B | B |
| | Pattern with size of 100 nm | ΔLWR | A | A | A | A | B | B | A | B | B | B |
| | | Defects | A | A | B | B | A | B | B | B | B | B |
| | Pattern with size of 500 nm | ΔLWR | A | A | A | A | B | B | A | B | B | B |
| | | Defects | A | A | A | A | A | A | B | A | A | A |

TABLE 4

| | | | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
|---|---|---|---|---|---|---|---|---|---|---|---|---|
| First curable composition | Polymerizable compound | A-1 | 60 | | | | 20 | | | 10 | | |
| | | A-2 | | | | | | | | | | |
| | | A-3 | | 50 | | 20 | | 60 | | 50 | | |
| | | A-4 | | | 20 | | 100 | | 60 | | | |
| | | A-5 | 40 | | | 40 | | 40 | 10 | 40 | | |
| | | A-6 | | 50 | 40 | | | | | | | |
| | | A-7 | | | | 40 | | | 30 | | 54 | |
| | | A-8 | | | 40 | | | | | | 15 | 48 |
| | | A-9 | | | | | | | | | | 48 |
| | | A-10 | | | | | | | | | | |
| | | A-11 | | | | | | | | | 27 | |
| | Photopolymerization initiator | B-1 | 2 | 1 | 1 | 1 | 2 | 2 | | | | |
| | | B-2 | | 1 | 1 | 1 | | | 2 | 2 | | |
| | | B-3 | | | 1 | | | | | | 3 | 4 |
| | Mold release agent | C-1 | 2 | | 2 | 2 | 2 | | | | | |
| | | C-2 | | 2 | | | | 3 | 3 | 3 | 1 | |
| | Onishi parameter | | 3.3 | 3.4 | 3.1 | 3.4 | 4.3 | 4.1 | 3.9 | 4 | 3.7 | 4.5 |
| | Proportion [% by mass] of polymerizable compound including aliphatic ring having crosslinked structure | | 0 | 0 | 40 | 60 | 0 | 0 | 30 | 10 | 54 | 0 |
| | Viscosity [mPa · s] at 23° C. | | 6 | 6 | 11 | 14 | 7 | 6 | 7 | 11 | <6 | <6 |
| First layer | Glass transition temperature [° C.] | | 80 | 75 | 65 | 70 | 80 | 70 | 65 | 75 | 50 | <50 |
| | Etching selectivity ratio to second layer | | 2.05 | 2.01 | 1.98 | 2.1 | 2.44 | 2.33 | 2.29 | 2.33 | 2.15 | 2.49 |
| Evaluation | Pattern with size of 30 nm | ΔLWR | C | C | D | D | C | C | E | E | E | E |
| | | Defects | B | B | C | D | C | C | D | D | D | D |
| | Pattern with size of 100 nm | ΔLWR | C | C | D | D | C | C | D | D | E | E |
| | | Defects | B | B | C | D | C | C | D | D | D | D |
| | Pattern with size of 500 nm | ΔLWR | C | C | C | D | C | C | D | C | D | D |
| | | Defects | B | B | C | C | C | C | C | C | D | D |

From the table, it could be seen that the pattern laminate obtained by the method for producing a pattern laminate of the present invention was a pattern laminate having a first layer having a pattern on an object to be processed and a second layer, which has a small waviness after etching (ΔLWR). Further, according to a preferred aspect of the present invention, it could be seen that a reversal pattern having less defects can be obtained.

In contrast, it could be seen that the pattern laminate obtained by the method for producing a pattern laminate in Comparative Examples 1 to 10 in which the glass transition temperature of the first layer was lower than 90° C. had a high waviness (ΔLWR) in the etching treatment. In particular, Comparative Example 9 is an example in which the composition 2 in US2004/0188381A (or JP2006-521702A which is a corresponding Japanese publication thereof) was used as the first curable composition, and the composition 3 in JP2006-521702A was used as the second curable composition, in which ΔLWR was significantly high. Comparative Example 10 is an example in which the materials described in [0011] of JP2006-524919A were additionally tested, in which ΔLWR was significantly high.

REFERENCE SIGNS LIST 1 first layer
2 second layer
10 object to be processed
11 adhesion material
20 pattern laminate
31 region having pattern of first layer exposed therein
32 region having first layer and second layer laminated therein
40 reversal pattern
D thickness of residual film contained in first layer
L line width of reversal pattern
M thickness for making second layer thin.

What is claimed is:

1. A method for producing a pattern laminate, comprising:
   forming a first layer having a pattern on an object to be processed; and
   forming a second layer on the first layer,
   wherein the glass transition temperature of the first layer is 100° C. or higher,
   the forming of a first layer includes forming a first layer by an imprint method using a first curable composition comprising a polymerizable compound having an ethylenically unsaturated bond-containing group,
   a proportion of the polymerizable compound having an ethylenically unsaturated bond-containing group which includes an aliphatic ring having a crosslinked structure, with respect to all polymerizable compounds included in the first curable composition, is less than 15% by mass,
   a proportion of a polymerizable compound having two ethylenically unsaturated bond-containing groups with respect to all polymerizable compounds included in the first curable composition is 50% or more by mass,
   a proportion of a polymerizable compound having one ethylenically unsaturated bond-containing group with respect to all polymerizable compounds included in the first curable composition is 10 to 35% by mass,
   an Onishi parameter of the first curable composition is less than 3.8,
   the second layer includes a Si atom-containing compound or a metal, and
   the forming of a second layer includes forming a second layer by curing a second curable composition including a Si atom-containing compound in a case where the second layer includes the Si atom-containing compound.

2. The method for producing a pattern laminate according to claim 1,
   wherein the pattern laminate is used for a reversion process.

3. The method for producing a pattern laminate according to claim 1, further comprising heating the second layer, and
   wherein the second layer includes the Si atom-containing compound.

4. The method for producing a pattern laminate according to claim 1,
   wherein the Onishi parameter of the first curable composition is less than 3.5.

5. The method for producing a pattern laminate according to claim 1,
   wherein the viscosity of the first curable composition at 23° C. is less than 10 mPa·s.

6. The method for producing a pattern laminate according to claim 1,
   wherein the first layer has a pattern with a size of 100 nm or less.

7. The method for producing a pattern laminate according to claim 1,
   wherein an etching selectivity ratio of the first layer to the second layer is 1.2 to 10.

8. The method for producing a pattern laminate according to claim 1,
   wherein the second curable composition includes at least one compound selected from the group consisting of a crosslinking agent component and a curing accelerator component.

9. A method for producing a reversal pattern, comprising the method for producing a pattern laminate according to claim 1, the method comprising:
   making the second layer thin until a region having the pattern of the first layer exposed therein and a region having the first layer and the second layer laminated therein are formed; and
   forming a reversal pattern by selectively etching the region having the pattern of the first layer exposed therein.

10. The method for producing a reversal pattern according to claim 9,
    wherein the making the second layer thin is an etch-back step of etching the second layer.

* * * * *